United States Patent
Moriya et al.

(10) Patent No.: US 7,196,796 B2
(45) Date of Patent: Mar. 27, 2007

(54) WAVELENGTH DETECTING APPARATUS, LASER APPARATUS, AND WAVELENGTH DETECTING METHOD

(75) Inventors: Masato Moriya, Hiratsuka (JP); Tatsuo Enami, Yokohama (JP); Hirokazu Kubo, Oyama (JP); Masashi Shinbori, Oyama (JP); Toru Suzuki, Hiratsuka (JP)

(73) Assignee: Gigaphoton, Inc., Tokyo (JP)

( * ) Notice: Subject to any disclaimer, the term of this patent is extended or adjusted under 35 U.S.C. 154(b) by 184 days.

(21) Appl. No.: 10/341,364

(22) Filed: Jan. 14, 2003

(65) Prior Publication Data

US 2003/0137672 A1    Jul. 24, 2003

(30) Foreign Application Priority Data

Jan. 21, 2002    (JP) .............................. 2002-011498

(51) Int. Cl.
*G01B 9/02*    (2006.01)
(52) U.S. Cl. ...................................... 356/454
(58) Field of Classification Search ................ 356/454, 356/450, 519, 480, 506; 372/33
See application file for complete search history.

(56) References Cited

U.S. PATENT DOCUMENTS

| | | | |
|---|---|---|---|
| 4,172,663 A * | 10/1979 | Byer et al. ................... 356/454 |
| 5,420,877 A | 5/1995 | Sandstrom | |
| 6,115,397 A * | 9/2000 | Heritier et al. ................ 327/33 |
| 6,667,804 B1 * | 12/2003 | Kleinschmidt .............. 356/326 |
| 6,788,724 B2 * | 9/2004 | Sell et al. ...................... 372/92 |

FOREIGN PATENT DOCUMENTS

| | | |
|---|---|---|
| JP | 61139721 | 8/1986 |
| JP | 0 3154390 | 7/1991 |
| JP | 05007045 | 1/1993 |
| JP | 0 6188502 | 7/1994 |
| JP | 1 1298084 | 10/1999 |
| JP | 2000 101177 | 4/2000 |
| JP | 2000 114621 | 4/2000 |
| JP | 2000 124534 | 4/2000 |
| JP | 2000 136964 | 5/2000 |
| JP | 2000 223761 | 8/2000 |
| JP | 2000 249600 | 9/2000 |
| JP | 2000 266605 | 9/2000 |
| WO | 9 607224 | 3/1996 |

OTHER PUBLICATIONS

Japanese Office Action dated Sep. 30, 2005 with partial English translation.
Japanese Office Action dated Sep. 28, 2006 with partial English translation.

* cited by examiner

*Primary Examiner*—Hwa(Andrew) Lee
(74) *Attorney, Agent, or Firm*—Stevens, Davis, Miller & Mosher, LLP

(57) ABSTRACT

In a wavelength detecting apparatus using an etalon, a drift in wavelength measurement by the etalon is stabilized and an adverse influence of out gas is eliminated, so that correct wavelength measurement is realized. The wavelength detecting apparatus includes a housing equipped with a port for use of introducing replacement gas, an etalon set inside the housing, and a moisture-absorbing unit for absorbing at least moisture released inside the housing.

4 Claims, 8 Drawing Sheets

$\theta = \cos^{-1}(r/f)$

WAVELENGTH DETECTING APPARATUS, LASER APPARATUS, AND WAVELENGTH DETECTING METHOD

BACKGROUND OF THE INVENTION

1. Field of the Invention

The present invention generally relates to a wavelength detecting apparatus and a laser apparatus containing such a wavelength detecting apparatus. More specifically, the present invention is directed to a wavelength detecting apparatus and a laser apparatus, capable of measuring and controlling a wavelength of a laser beam or the like to be outputted. Further, the present invention concerns a method for detecting a wavelength by employing such a wavelength detecting apparatus.

2. Description of a Related Art

Excimer lasers have been used as light sources of reduction-projection exposing apparatus (will be referred to as "stepper" hereinafter) for manufacturing semiconductor devices. Only synthetic quartz and fluorite (calcium fluoride) can be used as lens materials capable of sufficiently highly transmitting wavelengths (for example, 248.4 nm and 193 nm) of KrF and ArF excimer lasers, and also having better uniformity and high processing precision. Therefore, it is practically difficult to design reduction-projection lenses in which chromatic aberration has been corrected under spontaneous oscillating line widths (350 pm to 400 pm) of excimer lasers.

As a consequence, in the case where a laser beam having short wavelengths is employed as light sources of steppers, bandwidths of the output laser beam must be narrowed up to such line widths (approximately 0.6 pm) under which chromatic aberration is negligible. Moreover, wavelengths of the output laser beam whose bandwidth has been narrowed must be controlled under highly stable condition.

The stabilization of oscillating wavelengths of excimer lasers whose bandwidths had been narrowed is carried out in such a manner that a portion of excimer laser output light is entered into a spectroscope and is measured by employing either an etalon or a grating. The techniques for detecting (measuring) oscillating wavelengths of excimer lasers are disclosed in Japanese Patent Application Laid-open JP-A-11-298084 and JP-A-6-188502. In these publications, an etalon, which corresponds to a spectroscopic element formed based upon the theory of a Fabry-Perot interferometer, is employed so as to measure oscillating wavelengths of lasers.

FIG. 8 shows a construction of a general-purpose etalon. As shown in FIG. 8, the etalon 6 owns such a structure that two optical substrates 2, on which partial reflection films 1 are formed, are arranged via a spacer 3 in such a manner that planes of these partial reflection films 1 are located opposite to each other, while a predetermined air gap is maintained. The thickness of this spacer 3 is precisely managed. Each of the optical substrates 2 is fixed inside a protection housing 5 via an adhesive agent layer 4 formed by using adhesive agent having proper flexible, holding force, and stable characteristics. In this case, the spacer 3 may be properly formed by ceramics having less thermal expansion characteristics, for example, "Zerodur (registered trademark)". Alternatively, the etalon 6 may be fixed by a spring instead of the adhesive agent.

A wavelength measurement by the etalon 6 is carried out based upon the below-mentioned basic formula (1) of the Fabry-Perot interferometer.

$$m\lambda = 2nd \cdot \cos\theta \quad (1)$$

where symbol "m" represents an order (integer), symbol "d" represents a length of the air gap, symbol "n" represents a refractive index of a gaseous body between the air gaps, and also, symbol "θ" represents an angle (fringe angle) defined between a normal line of the partial reflection film plane of the etalon 6 and an optical axis of incident light.

Light entered into the etalon 6 forms a fringe waveform. FIG. 9A is a diagram for representing a basic idea as to forming of a fringe waveform, and FIG. 9B is a diagram for representing a relationship between a fringe waveform detected by a sensor and optical intensity thereof.

In FIG. 9A, light which has transmitted the etalon 6 where two sheets of optical substrates 2 are arranged in parallel to each other is focused by a lens 7 at a position of a focal distance "f" of this lens 7, and then this light forms a fringe waveform 8. At this time, when both a wavelength "λ" of this light and a fringe angle "θ" satisfy the above-mentioned basic formula (1) of the Fabry-Perot interferometer, the light can pass through the etalon 6 under such a condition that phases of light reflected in a multiple mode within this etalon 6 are made coincident with each other, and then can be collected by the lens 7 at a specific position. Although only one incident light "L" is illustrated in FIG. 9A, since light penetrated through a scattering plate is traveled along various directions, a collected light image of such light capable of satisfying the above-mentioned formula (1) constitutes a plurality of coaxial circles, as indicated in FIG. 9A. When a photodetector is set at the focal position of the lens where these coaxial circles are formed, the photodetector detects strong optical intensity at the positions of the coaxial circles as shown in FIG. 9B, and thus can acquire a fringe waveform 9 that is a coaxial-shaped strong/weak pattern (interference fringe). This fringe waveform 9 is imaged by a semiconductor image sensor such as a CCD. Since positions of the imaged fringe waveform 9 as shown in FIG. 9B are detected, a fringe radius "r", is calculated, and then, the fringe radius "r" is converted into the fringe angle "θ" based upon a formula: $\theta = \cos^{-1}(r/f)$. Thus, the wavelength "λ" of the incident light "L" may be detected by employing the above-mentioned formula (1).

Since the refractive index "n" of the gas existed between the air gaps of the etalon 6 is changed depending upon density distributions of the gas, which are caused by temperature distributions and pressure distributions of this gas, the fringe angle "θ" with respect to the same wavelength "λ", is changed, and thus, measurement results of wavelengths are varied in connection with a time elapse. Accordingly, when a precise measurement is required, calibration must be regularly carried out. For instance, Japanese Patent Application Laid-open JP-A-11-298084 discloses such a technique for performing calibration while absorption lines of atoms caused by platinum vapor and iron vapor are used as reference wavelengths. Also, Japanese Patent Application Laid-open JP-A-6-188502 describes another technique for performing calibration while an emitted ray of a low-pressure mercury lamp is employed as a reference wavelength. However, in the calibration technique disclosed in Japanese Patent Application Laid-open JP-A-11-298084, since the wavelength of the laser beam must be scanned so as to search the reference wavelength in the calibration, the downtime condition occurs, under which the laser cannot be utilized as the light source of the semiconductor manufacturing stepper, during the calibration. As a consequence, the above-explained calibration cannot be performed other than a limited time duration such that, for instance, the calibration may be limitedly performed one time when laser gas is replaced (every 1 week).

In order to eliminate the calibration (especially, calibration requiring downtime) which is required in connection with changes in peripheral environments (temperatures and pressure) of etalons, or in order to prolong at least execution intervals of calibration, the following idea is conceivable. That is, etalons may be arranged inside, for example, a housing having an airtight characteristic, into which stable gas such as dry nitrogen gas is filled. With employment of such a structure, variations of the refractive index "n" of the gas between the air gaps may be reduced. Alternatively, peripheral temperatures of the housing may be made constant. Also, while temperatures and pressure inside the housing are measured by employing sensors, measured wavelengths may be corrected based upon the refractive index "n" of the gas between the air gaps of the etalon and the thermal expansion of the spacers. These techniques are disclosed in, for instance, Japanese Patent Application Disclosure JP-A-10-506232, which corresponds to WO 96107224, and Japanese Patent Application Laid-open No. 2000-136964.

However, the following fact can be revealed. That is, drifts in measured wavelengths of etalons are conducted not only by the refractive index "n" of the gas between the air gaps and the length variation of the air gaps, but also other serious factors.

Normally, a partial reflection film formed on one plane of an etalon is formed by way of a multi-layer coating in which substances having different refractive indexes are alternately coated (so-called "multi-layer thin-film coating"). In the case of such an etalon which measures ultraviolet light such as an excimer laser beam and a fluorine molecular laser beam, a multi-layer thin-film made of either an oxide film or a fluoride film is formed by which less ultraviolet light is absorbed. Among these multi-layer thin-films, it is known that characteristics (refractive index, spectroscopic transmittance, thickness etc.) of a certain thin-film are changed by highly responding to moisture or vapor of peripheral environments in connection with absorption or desiccation of the moisture. This characteristic change may shift the fringe angle "θ" and may cause errors in wavelength measuring operations. An adverse influence caused by the shift of the fringe angle "θ" due to the characteristic change of this partial reflection film has not been considered when wavelengths of incident light were calculated by employing the basic formula (1) of the wavelength measurement by the etalons.

As a consequence, even when an error caused by temperature and pressure changes between air gaps is continuously corrected based upon the basic formula (1) of a wavelength measurement by an etalon in an interval of regular calibration of the etalon, a fringe angle "θ" caused by characteristic changes in water absorption or desiccation of a partial reflection film is shifted and an error of the wavelength measurement is increased.

The calibration formula employed in the wavelength calibration in Japanese Patent Application Laid-open JP-A-11-292084 is given as follows:

$$\lambda = \lambda_0 + Cd(r^2 - r_0^2) + N \cdot FSR \qquad (2)$$

In this formula (2), symbol "λ" represents a wavelength corresponding to the fringe radius "r"; symbol "$\lambda_0$" represents a wavelength corresponding to another fringe radius "$r_0$" and constitutes a reference of calibration; symbol "Cd" represents a constant depending upon optical design; symbol "FSR" represents a free spectrum range of the etalon; and also symbol "N" represents an integer.

In accordance with this publication, when an absolute wavelength is calibrated, an oscillating wavelength of a narrow-band-oscillated excimer laser is scanned, and light intensity of absorption lines given by platinum vapor in a platinum bubble cell is monitored. In this case, at the same time, the radius "r" of the fringe waveform is monitored, and such a radius is stored as the radius "$r_0$" of the fringe waveform at the wavelength "$\lambda_0$" when the light intensity absorbed by the platinum bubble cell becomes maximum, so that the absolute wavelength calibration is carried out in a regular manner.

Also, the calibration formula employed in the wavelength calibration in Japanese Patent Application Laid-open JP-A-6-188502 is given as follows:

$$\lambda = \lambda_e + FSR(r^2 - r_0^2)/C \qquad (3)$$

In this formula (3), symbol "λ" represents a wavelength corresponding to the fringe radius "r"; "$\lambda_e$" represents a wavelength of light to be detected when a fringe radius of reference light of calibration is coincident with a fringe radius of the light to be detected; symbol "$r_0$" represents a fringe radius of the reference light; symbol "C" represents a constant depending upon optical design of the etalon; and symbol "FSR" represents a free spectrum range of the etalon.

In accordance with this publication, instead of the narrow-band-oscillated excimer laser, the oscillated light of the mercury lamp is employed so as to detect the. radius "$r_0$" of the fringe waveform of the etalon. Also, the constant "C" is calculated from the detected fringe waveform. Thus, the fringe radius "$r_0$" of the reference light and the constant "C" in the formula (3) are adjusted.

However, both the formulae (2) and (3) are introduced based upon the basic formula (1) of the Fabry-Perot interferometer. If the fringe angle "θ" is shifted in connection with the water absorption or the desiccation of the partial reflection film, then these values of r, $r_0$, FSR, Cd, $\lambda_e$ and C in the formula (2) or (3) are changed. For instance, in the formula (3), since the refractive index "n" of the gas between the air gaps is changed in response to the environmental change, the adjustment of the values "$r_0$" and "C" is regularly carried out. However, in the case where the wavelength of the reference light is largely separated from the wavelength of the excimer laser (for example, 253.7 nm of mercury lamp and 193 nm of ArF), the shift in the fringe angle "θ" in connection with the water absorption or the desiccation of the partial reflection film of the etalon may essentially change the wavelength "$\lambda_e$" to be detected in the etalon spectroscope, so that measurement errors of wavelengths are conducted. This phenomenon is conceived as follows. That is, a relationship between the wavelength of the light source which constitutes the reference of calibration and the optical path difference of the partial reflection films of the etalon in each of the wavelengths of the laser beam to be monitored is changed due to the water absorption or the desiccation of the film.

Similarly, also in the formula (2), the value FSR is handled as a substantially constant value with respect to variations caused by the environmental change as to the refractive index "n" of the gas between the air gaps. However, since the optical path length between the partial reflection mirrors of the etalon is changed due to the water absorption or the desiccation of the partial reflection film of the etalon, the fringe angle "θ" is shifted, which may cause the measurement error of the wavelength.

When air contained in the housing, where the etalon is arranged, is replaced with dry nitrogen gas, an increase of gas density inside the housing may be observed just after the gas replacement has been accomplished. It should also be noted that this expression "gas density" implies density of all sorts of gaseous bodies containing vapor inside the housing. This increase of gas density is caused due to the following reasons. That is, moisture or the like, which have been present from the beginning or absorbed on the wall surfaces of the housing, especially plated materials or optical components arranged inside the housing, is gasified (namely, out gas is produced) and then the gaseous moisture are released into the dry nitrogen gas. In this case, moisture absorbed in the partial reflection film of the etalon is released into the dry nitrogen gas for a few minutes after sealing. To the contrary, when the amount of moisture released into the dry nitrogen gas is increased, such a phenomenon will occur. That is, a portion of the moisture contained in the dry nitrogen gas is very slowly reabsorbed into the partial reflection film of the etalon. In these stages, the above-mentioned sifts of the fringe angle "θ" may occur in connection with the water absorption or the desiccation of the partial reflection film of the etalon. Also, shifts of the fringe angle "θ" may similarly occur even when a laser beam is irradiated. In other words, moisture which has been absorbed into the partial reflection film of the etalon is released into the dry nitrogen gas when the laser beam is irradiated thereto and the released moisture is reabsorbed by the partial reflection film when the irradiation of this laser beam is ceased, thereby the shift of the fringe angle "θ" occurs.

In the case of executing, for example, calibration just after gas replacement which calibration is accompanied with downtime and can be carried out only once per one week within a limited time, wavelength measurement errors are increased between calibration executing works, which may cause a high precision measurement to be hardly realized.

Also, after internal gas components of the housing where the etalon is arranged have been replaced with dry nitrogen gas, substances other than moisture are gasified from the plated materials, the partial reflection films and so on, so that so-called "out gas" is exhausted. This "out gas" corresponds to moisture and other substances which have been present or absorbed in the wall surfaces of the housing and the optical components provided in this housing. As the substances other than the moisture, for example, the following substances may be conceived, namely, volatile substances derived from adhesive agent used in the housing, processing oil left on machine processing components, and cleaning alcohol used when the housing is assembled. Also, if such strong ultraviolet rays as the excimer laser beams are irradiated onto the optical components employed in the housing, then it is so conceived that gas is produced due to chemical changes.

When the composition of the dry nitrogen gas filled up inside the housing is varied in either a short time period or a long time period due to generations of the out gas (containing moisture), the refractive index "n" of the gas between the air gaps in the basic formula (1) of the Fabry-Perot interferometer is varied, so that an error occurs in the wavelength measurement. This variation of the refractive index "n" owns an essentially different factor from the factor which is caused by the changes in the temperatures and pressure of the gas. As a result, even when the error correction for the temperature change and the pressure change is carried out, this error of the above-mentioned wavelength measurement could not be corrected.

As explained above, since the out gas is produced just after the replacement of dry nitrogen gas, the refractive index "n" is varied. As a result, during several days to one week after the gas replacement has been carried out, the wavelength measuring apparatus cannot be utilized. Therefore, the calibration operation of the wavelength measuring apparatus must be postponed until the refractive index "n" becomes stable, and also, the manufacturing steps of the semiconductor devices cannot be executed in higher efficiencies.

Furthermore, depending upon the sort of the out gas, there is another problem that the generated out gas is adhered on the surfaces of the optical components and thus may cause trouble in optical performance.

SUMMARY OF THE INVENTION

The present invention has been made to solve the above-mentioned problems, and therefore, owns an object to provide wavelength detecting apparatus and method using an etalon, and also a laser apparatus using such a wavelength detecting apparatus, capable of stabilizing a drift contained in wavelength measurement by using the etalon and eliminating an adverse influence of out gas so as to realize correct wavelength measurement.

To achieve the above-mentioned objects, a wavelength detecting apparatus according to one aspect of the present invention comprises: a housing to be sealed and equipped with a port for use of introducing replacement gas; an etalon set inside the housing; and a moisture-absorbing unit for absorbing at least moisture released inside the housing.

Further, a laser apparatus according to one aspect of the present invention comprises: a laser oscillator for generating a laser beam having a narrowed band; a wavelength detecting apparatus for detecting a wavelength of the laser beam generated from the laser oscillator, the wavelength detecting apparatus including a housing to be sealed and equipped with a port for use of introducing replacement gas, an etalon set inside the housing, and a moisture-absorbing unit for absorbing at least moisture released inside the housing; and control means for controlling an oscillating wavelength of the laser oscillator on the basis of a detection result of the wavelength detecting apparatus.

Furthermore, a wavelength detecting method according to one aspect of the invention comprises the steps of: (a) supplying replacement gas to an internal portion of a sealed housing for storing thereinto both an etalon and a moisture-absorbing unit for absorbing at least moisture; and (b) detecting a wavelength of light in an interference fringe formed by the etalon, by using a photodetector arranged outside the sealed housing.

According to the present invention, the moisture-absorbing agent absorbs the moisture and the organic articles released into the replacement gas just after the internal gas of the housing is replaced with the replacement gas and is sealed. As a result, the partial reflection film of the etalon is continuously brought into desiccation condition. Since a shift of a fringe angle "θ" caused by that the partial reflection film absorbs water and desiccates is reduced, values used in the basic formula of the wavelength measurement by the etalon can be stably adapted for a long time period, and there is a less error in the wavelength measurement. Since gas contained in the housing is always maintained under dry condition, change in a refractive index of gas present in an air gap is also reduced, and an error of wavelength measurement caused by this change may be reduced.

DESCRIPTION OF THE PREFERRED EMBODIMENTS

Figure 1:
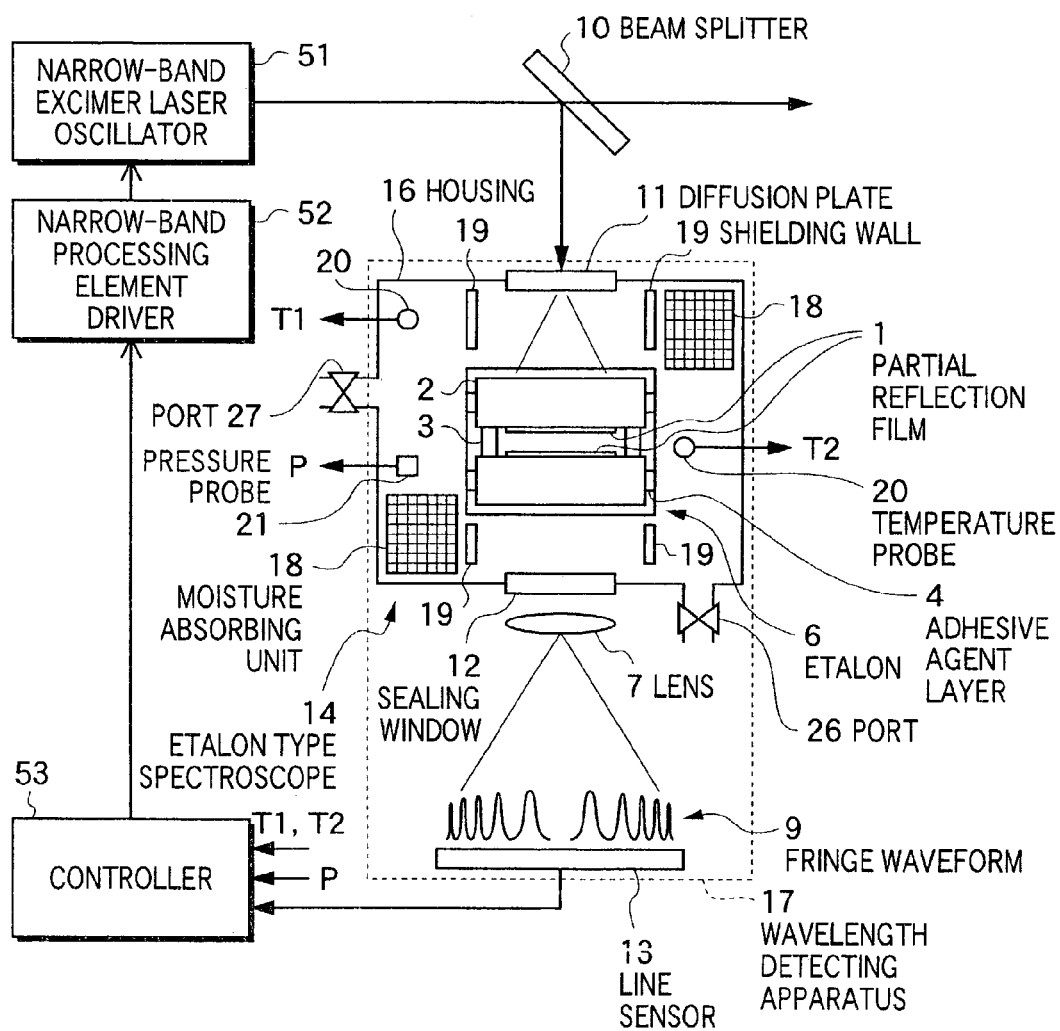
FIG. 1 is a diagram for showing an arrangement of a laser apparatus according to a first embodiment of the present invention.

Referring now to drawings, a description will be made of various embodiments of the present invention. It should be understood that the same reference numerals will be employed as those for indicating the same structural elements, and explanations thereof are omitted.

FIG. 1 shows an arrangement of a laser apparatus according to a first embodiment of the present invention, which includes a wavelength detecting apparatus. In FIG. 1, the laser apparatus is equipped with a narrow-band excimer laser oscillator 51 which oscillates a laser beam having a narrow band. A beam splitter 10 is arranged at a right hand of the narrow-band excimer laser oscillator 51, and a wavelength detecting apparatus 17 is arranged under this beam splitter 10.

The wavelength detecting apparatus 17 includes an etalon type spectroscope 14, a lens 7, and a line sensor 13. The etalon type spectroscope 14 includes a sealed housing 16, an etalon 6 arranged inside this housing 16, and a moisture-absorbing unit (substance absorbing unit) 18. The etalon 6 is constructed in such a manner that two optical substrates 2, on which partial reflection films 1 are provided respectively, are arranged via a spacer 3 having a precisely managed thickness so that these partial reflection films 1 are located opposite to each other while maintaining a predetermined air gap. The respective optical substrates 2 are fixed inside the housing 16 by employing an adhesive agent layer 4 having proper elastic characteristics, holding characteristics and stable characteristics. In this case, as a material of the partial reflection film 1 of the etalon 6, fluorine compounds (for example, $GdF_2$ and $NaAlF_4$) may be preferably used, the light absorption of which is small in wavelengths of vacuum ultraviolet laser beams such as an ArF laser beam.

Inside of the housing 16, two sets of moisture-absorbing units 18 are arranged at two corner portions of this housing 16 along a diagonal line. These moisture-absorbing units 18 may effectively absorb moisture present inside the housing 16. A diffusing plate 11 is arranged at an upper portion of the housing 16. The diffusing plate 11 diffuses a laser beam which is partially reflected by the beam splitter 10 so as to uniform the diffused laser beam. A sealing window 12 is mounted at a lower portion of the housing 16, under which the lens 7 is provided. Shielding walls 19 are arranged in a space between the diffusing plate 11 and the etalon 6, and another space between the sealing window 12 and the etalon 6. These shielding walls 19 may prevent a laser beam reflected by the beam splitter 10 from being irradiated to the moisture-absorbing portion 18. Thus, this wavelength detecting apparatus 17 is designed so that there is no quality change in moisture-absorbing agent, for example, a desiccator filled in the moisture-absorbing unit 18 when a laser beam is irradiated thereto, and that so-called "out gas" is never produced from this desiccator. It should be noted that the shielding walls 19 are not arranged in order that the moisture-absorbing units 18 are completely and spatially separated without achieving the absorbing function but are designed to shield the laser beam. Therefore, the shielding walls 19 may preferably own gas permeability. A port 27 for sealing replacement gas is provided on a left wall of the housing 16, and another port 26 for exhausting the replacement gas is provided on a lower wall of the housing 16. Both a temperature probe 20 for detecting a temperature and a pressure probe 21 for detecting pressure are arranged inside the housing 16.

A laser beam emitted from the narrow-band excimer laser oscillator 51 is split by the beam splitter 10, and a portion of this laser beam is reflected. The reflected laser beam passes through the diffusing plate 11 as an incident window of the etalon type spectroscope 14, and thereafter is scattered, and then the scattered laser beam is entered into the etalon 6. After the incident laser beam has penetrated the optical substrates 2 of the etalon 6 and has passed through the sealing window 12, this incident light forms a fringe waveform 9 at a focal distance position of the lens 7 in accordance with the above-mentioned basic formula (1) of the wavelength measurement by the etalon. The formed fringe waveform is imaged by a line sensor 13 such as a MOS sensor or a CCD sensor so as to detect a position of the fringe waveform 9. This detected position is converted into a fringe angle "θ", so that a wavelength "λ" of this incident light is calculated based upon the basic formula (1). The detection result is transferred to a controller 53, and then, this controller 53 controls a narrow-band processing element driver 52 to drive a narrow-band processing element based upon the detection result, so as to control wavelengths of the laser beam emitted from the narrow-band excimer laser oscillator 51.

In this embodiment, the housing 16 owns a sealed structure having an airtight characteristic by using an O-ring or the like at a boundary portion of the diffusing plate 11 and a boundary portion of the sealing window 12. One or more ports (two ports in this case) are formed in the housing 16, which are equipped with sealing valves used to fill thereinto dry nitrogen gas or the like. A gaseous body (air at an initial stage) in the housing 16 is sucked through the port 26 by using a vacuum pump, and dry nitrogen gas is fed through the port 27 to fill the housing 16, so that a gas replacement (gas substitution) is carried out. Finally, after the pressure in the housing 16 is adjusted, the respective sealing valves of the ports 26 and 27 are closed, and then, the gas replacement of the housing 16 is accomplished. The pressure in the housing 16 is controlled to be, for instance, atmospheric pressure. As the replacement gas, for instance, dry nitrogen gas and dry inert gas (helium, argon, neon gas etc.) can be used.

Also, each of the temperature probe 20 for measuring temperature of gas contained in the housing 16 and the pressure probe 21 for measuring pressure of the gas is arranged at one or more places inside the housing 16. The temperature probe 20 is, for instance, a platinum resistance probe, whereas the pressure probe 21 is a probe for measuring pressure from, for example, a resonant frequency of a silicon membrane.

The moisture-absorbing unit 18 arranged in the housing 16 has a function of absorbing such gaseous bodies (gas) as moisture, carbon dioxide and oxygen, and involves moisture (substance) absorbing agent or the like. The necessary condition for the substance-absorbing agent is that the absorbed moisture or gas is not unnecessarily removed and that chemical characteristic thereof is not changed and so-called out gas is not produced by irradiating a laser beam or an ultraviolet ray to the absorbing agent. In this case, as the absorbing agent to be used, such absorbing agent is preferably employed that can effectively absorb moisture, carbide gas (carbon dioxide, etc.), oxygen and so on. For example, such an absorbing agent as zeolite may be used. Concretely speaking, "Molecular sieve 4A" and "Molecular sieve 13X" (trade names of UNION SHOWA COMPANY) may be employed in which crystal zeolite has been mixed into an inert binder. The composition of "Molecular sieve 4A" is $Na_{12}[(AlO_2)_{12}(SiO_2)_{12}].27H_2O$. The composition of "Molecular sieve 13X" is $Na_{86}[(AlO_2)_{56}(SiO_2)_{105}].xH_3O$. As substances absorbed by "Molecular sieve 4A", there are water, $NH_2$, $H_2S$, $CO_3$, $C_2H_6$, $C_3H_6$, $C_2H_5OH$, etc. This "Molecular sieve 4A" may be preferably employed in a dry treatment and an elimination of $CO_2$. The "Molecular sieve 13X" absorbs molecules having effective diameters smaller than or equal to 10 angstrom, and may be suitably used in desulfurization, drying, simultaneous elimination of moisture and $CO_2$, absorption of hydro carbon and so on. As explained above, these absorbing agents may also absorb organic substances. As a result, the following two effects could be confirmed. (1) Since the organic substances and $CO_2$ generated by the laser beam are absorbed by the molecular sieves inside the housing 16, the gaseous body between the air gaps of the etalon 6 is only the dry nitrogen gas or dry inert gas, so that the change in the refractive index caused by the change in the gas composition may be reduced. (2) Since the organic substances are absorbed, chemical elements of C, S, Si can be hardly adhered to the optical elements such as the etalon 6, so that lifetime of the optical elements is largely extended. As to absorption of moisture, such moisture-absorbing agent as silica gel, phosphorus pentoxide and so on may be used.

In such a case where the moisture-absorbing agent collides with each other and causes friction with vessels by receiving external vibrations so that the moisture-absorbing agent is destroyed and dust is produced, the optical components arranged inside the housing 16 are contaminated. Therefore, the moisture-absorbing agent preferably owns superior anti-abrasion characteristics. On the other hand, there is no specific shape limitation as to shapes of the moisture-absorbing agent. For example, bead-shaped, powder-shaped, and block-shaped moisture-absorbing agent may be employed. When anti-abrasion characteristic point is considered, in the case of the molecular sieve, bead-shaped moisture-absorbing agent which is modeled by using a binder is preferably employed rather than such a pellet-shaped moisture-absorbing agent. Also, it is desirable to previously perform the reproducing process operation of the moisture-absorbing agent. For instance, in the case of the molecular sieve, the moisture-absorbing performance is reproduced by executing the thermal treatment for 10 hours at a temperature of 250° C. in a heating furnace sucked under vacuum pressure.

Figure 2A:
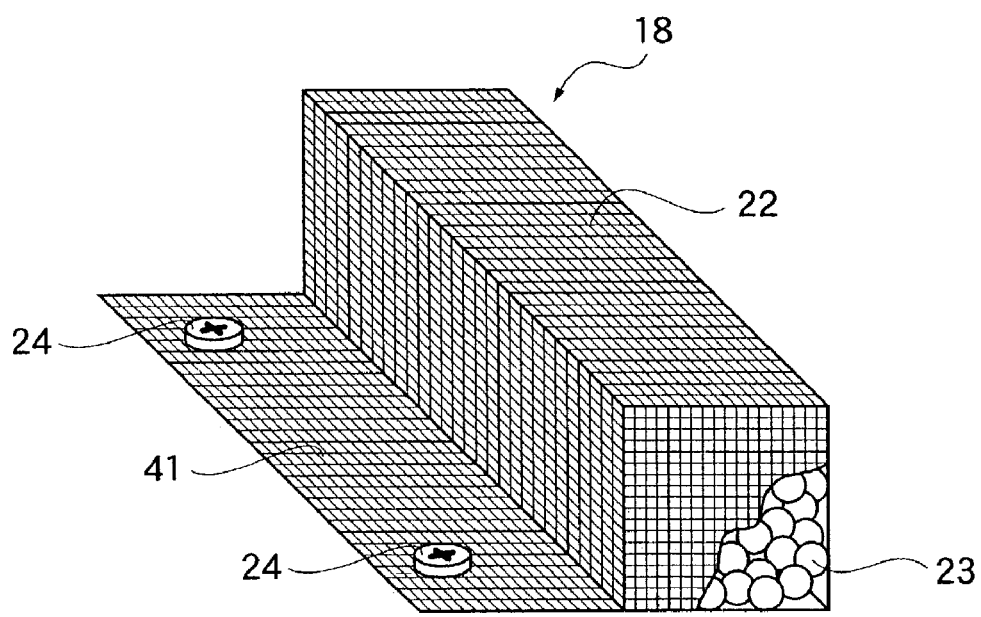
FIG. 2A and FIG. 2B are diagrams for showing concrete examples of a moisture-absorbing unit employed in a wavelength detecting apparatus according to a first embodiment of the present invention.
Figure 2B:
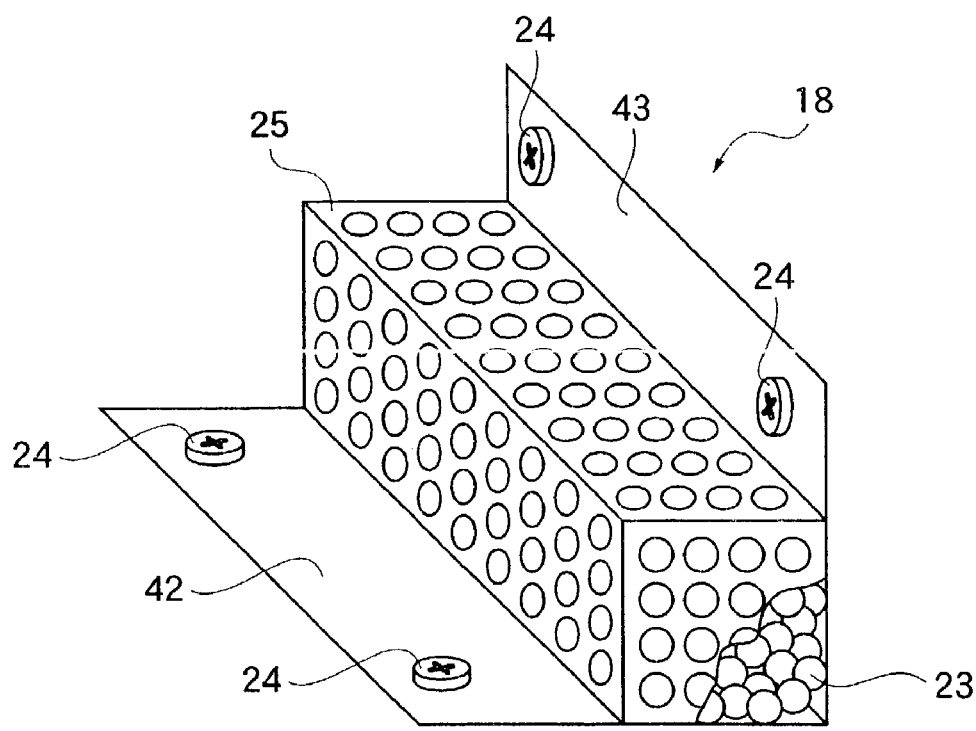

A concrete example of the moisture-absorbing unit 18 used in the etalon spectroscope will be explained. FIG. 2A shows a first concrete example of the moisture-absorbing unit, and FIG. 2B shows a second concrete example of the moisture-absorbing unit. In FIG. 2A, a vessel 22 has a rectangular prism shape of a mesh type. Moisture-absorbing agent 23 can be held inside the vessel 22 of the mesh type. In this case, this vessel 22 may be preferably made of either a metal or a plated material which owns ultraviolet withstanding characteristics such as aluminum and stainless steel. Also, a dimension of the mesh must be determined in such a manner that the moisture-absorbing agent 23 held in this vessel 22 does not jump out.

In order to avoid such a condition that the setting position of the vessel 22 is shifted or the vessel 22 is reversed by receiving external vibrations to disturb the optical path, this vessel 22 is preferably fixed to the housing 16 at at least one position thereof. In this case, the vessel 22 has a fixing portion 41 which is formed by extending a bottom plane of this vessel 22. The fixing portion 41 is fixed to the housing 16 by employing a fixing member 24 such as a screw.

In FIG. 2B, a vessel 25 is a vessel which has a rectangular prism shape and which is formed of a perforated material plate, for example, a punching metal. The moisture-absorbing agent 23 can be held inside this perforated vessel 25. In this case, the vessel 25 may be preferably made of a metal which owns ultraviolet withstanding characteristics such as aluminum and stainless steel. Also, a dimension of this perforation must be determined in such a manner that the moisture-absorbing agent 23 held in this perforated vessel 25 does not jump out.

To avoid such a condition that the setting position of the vessel 25 is shifted or the vessel 25 is reversed by receiving external vibrations to disturb the optical path, this vessel 25 is preferably fixed to the housing 16 at at least one position thereof. In this case, the vessel 25 has two fixing portions 42 and 43 which are formed by extending a bottom plane of this vessel 25 and also a side plane thereof. These fixing portions 42 and 43 are fixed to the housing 16 by using a fixing member 24 such as a screw.

In these concrete examples, the vessel having a rectangular prism shape and made of either the mesh-shaped plate or the perforated plate has been exemplified. In such a case where no vibration is applied to the housing 16, a vessel having a partially opened shape may be employed. Alternatively, moisture-absorbing agent may be directly arranged inside the housing without being stored in any vessel.

Figure 3:
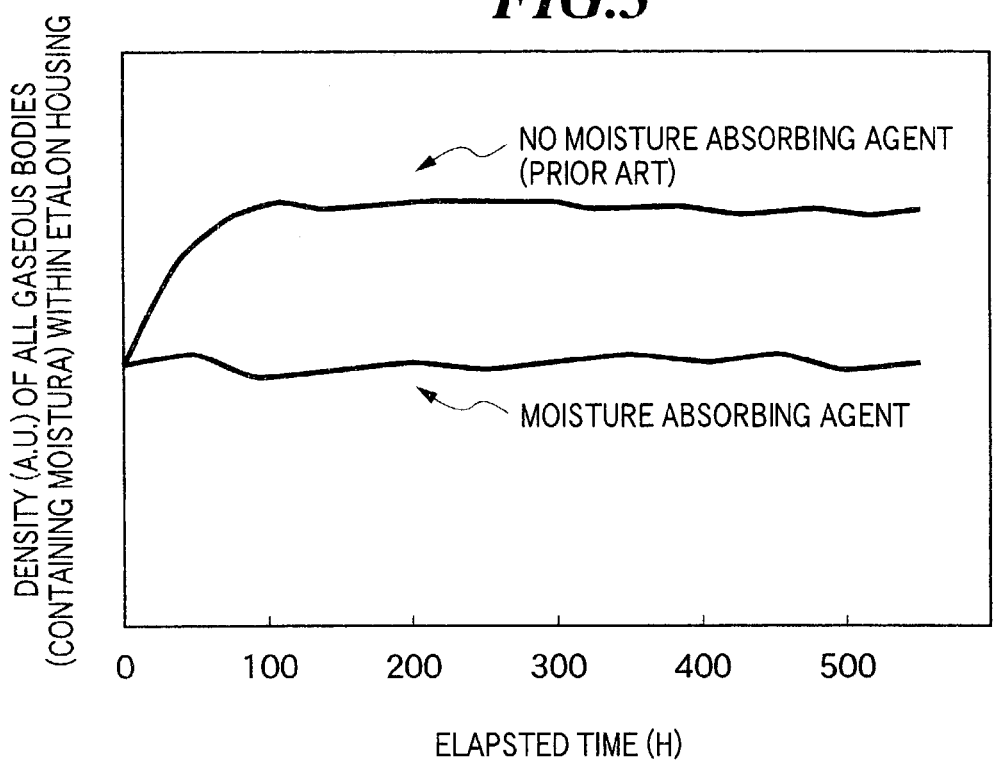
FIG. 3 is a graph for showing temporal changes of gas density inside a housing of an etalon type spectroscope in both cases where moisture-absorbing agent is provided in this housing and is not provided.

When a wavelength detecting operation is carried out by employing the laser apparatus shown in FIG. 1 in which the moisture-absorbing unit 18 is installed inside the housing 16, after the internal gas of the housing 16 has been replaced with dry nitrogen gas, an increase of the initial pressure can be suppressed and there is a small variation in the detected wavelength. FIG. 3 graphically shows temporal changes in gas density inside a housing of an etalon type spectroscope in both cases where a moisture-absorbing unit is installed in this housing and is not installed therein. As shown in FIG. 3, in the conventional etalon type spectroscope provided with the moisture-absorbing unit, the gas density of the housing is increased just after the internal gas has been replaced with dry nitrogen gas. To the contrary, in such an etalon type spectroscope as shown in FIG. 1 in which the moisture-absorbing unit has been installed, an increase of overall gas density immediately after the internal gas has been replaced with dry nitrogen gas does not appear. The moisture and the out gas produced from the partial reflection films, the adhesive agent layers and the housing inner walls which constitute the etalon are absorbed by the moisture-absorbing agent. Thus, the entire gas density is maintained at a constant value.

Figure 4:
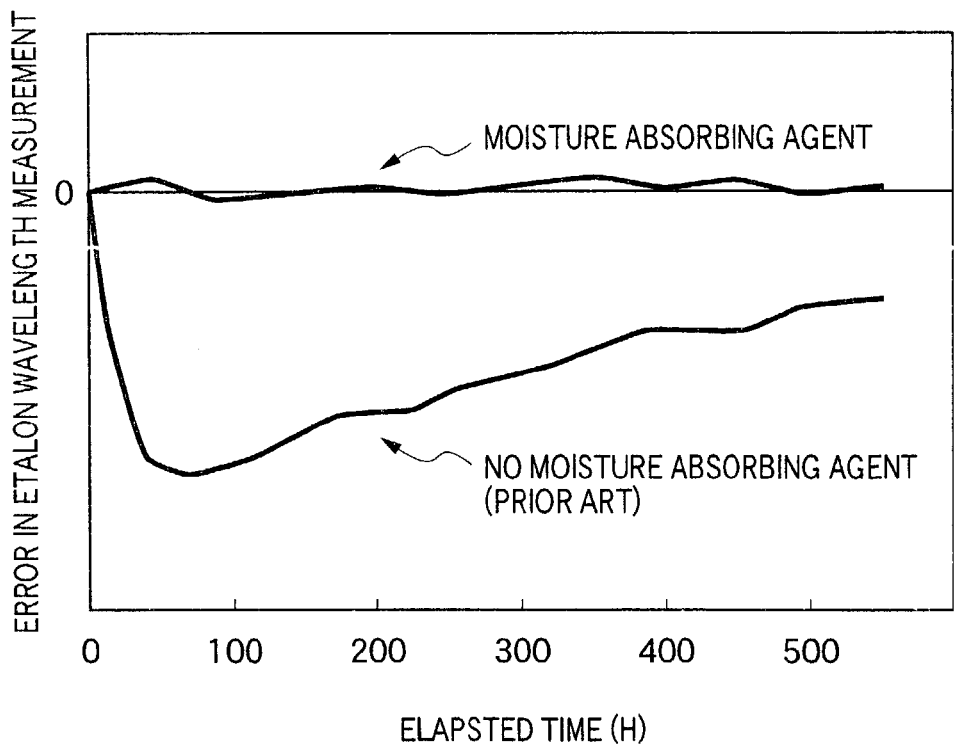
FIG. 4 is a graph for showing temporal changes of wavelength measurement error as to the etalon type spectroscope in both cases where the moisture-absorbing agent is provided in this housing and is not provided.

Also, FIG. 4 graphically shows temporal changes in measurement errors of measured wavelengths in two cases where a moisture-absorbing unit is installed in a housing of an etalon type spectroscope and is not installed therein. In the etalon type spectroscope provided with the moisture-absorbing unit, since pressure values of the moisture and the gas are kept constant owing to the moisture-absorbing agent filled into the moisture-absorbing unit as shown in FIG. 3, there is substantially no measurement error of wavelengths as shown in FIG. 4. On the other hand, in the case where the moisture-absorbing unit is not installed, moisture and so on are released from the housing walls just after the inner gas has been replaced with dry nitrogen gas. Subsequently, the moisture and so on which are gradually released are absorbed by the housing walls and coating films of the etalon.

As explained above, the out gas (containing moisture), which is produced from the partial reflection films, the adhesive agent layers, the housing inner walls and so on constituting the etalon, may be absorbed by the moisture-absorbing agent. Since the moisture is relatively gently released, several weeks are required until the inner condition of the housing may become stable by way of perfect desiccation. To solve this problem, a baking process operation is preferably carried out. Next, such a laser apparatus suitable for performing this baking process operation will be explained as follows.

Figure 5:
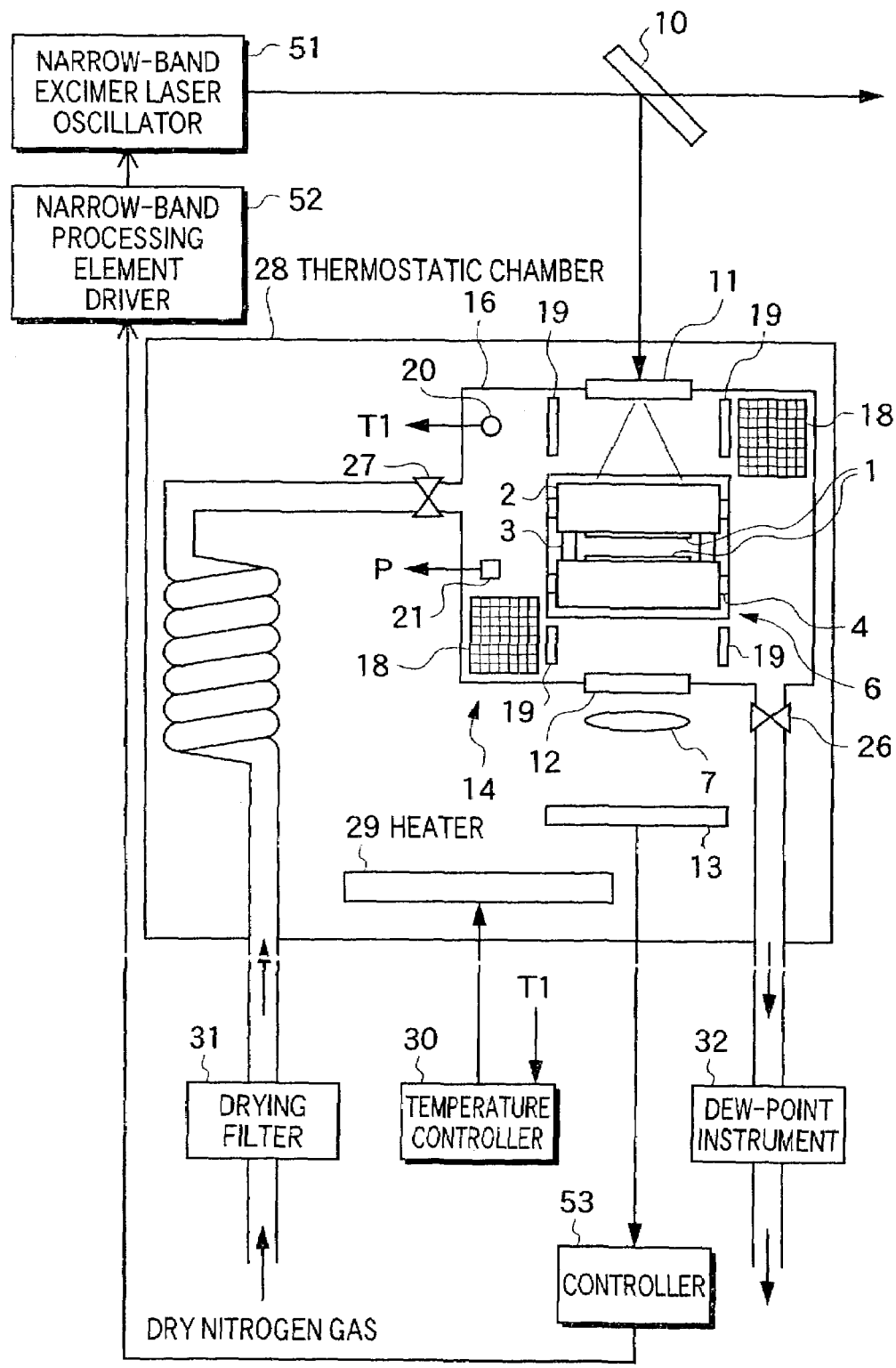
FIG. 5 is a diagram for showing an arrangement of a laser apparatus according to a second embodiment of the present invention.

FIG. 5 is a diagram showing an arrangement of a laser apparatus according to a second embodiment of the present invention. In this second embodiment, an etalon type spectroscope 14, a heater 29 equipped with a temperature controller 30 and a pipe used to seal replacement gas (dry nitrogen gas, etc.) are arranged in a thermostatic chamber 28 under such a design concept that a passage of this replacement gas-filling pipe within the thermostatic chamber 28 is made long. A drying filter 31 into which desiccating agent has been filled is arranged in the replacement gas-filling pipe, and a dew-point instrument 32 is arranged in an exhausting pipe.

In this laser apparatus, under temperature control operation of the temperature controller 30, the heater 29 is heated so as to execute the baking process operation in such a manner that a temperature of a gaseous body inside the housing 16 is controlled to become a predetermined temperature, for instance, 60° C. Next, while a temperature of replacement gas is controlled to become the normal temperature (e.g., 25° C.), this temperature-controlled replacement gas is supplied into the gas-filling pipe, and after waiting such a condition that the temperature inside the housing 16 becomes the normal temperature, the valves of both the ports 26 and 27 are closed. When the replacement gas is filled, it is preferable to fill the replacement gas while confirming such a fact that the pressure inside the housing 16 becomes equal to the atmospheric pressure by using, for instance, a barometer (not shown). As to the replacement gas, it is preferable to use a sufficiently dried gas that has been filtered by the drying filter 31.

Also, it is preferable to fill the replacement gas while an amount of moisture contained in exhausted gas is monitored by employing the dew-point instrument 32 which is installed in an exhausting pipe located at a down stream of the port 26. Since a time duration until the replacement gas within the pipe reaches the port 26 can be increased by increasing a length of the replacement gas-filling pipe within the housing, the temperature of the replacement gas within the pipe can be effectively approximated to the temperature inside the housing. This arrangement can have such a merit that heat can be effectively utilized and also the baking effect can be highly achieved.

In this second embodiment, the baking process operation may be carried out outside the housing 16. For instance, the replacement gas which has been previously heated up to approximately 60° C. by employing a heater or the like may be continuously supplied from the port 27 into the etalon spectroscope 16 while the gaseous body contained in the etalon spectroscope 16 may be continuously exhausted from the port 26, so that the inner space of the housing 16 can be filled with the baking-processed replacement gas, and thus, the out gas (containing moisture) present inside the housing 16 may be forcibly exhausted. In this case, the above-mentioned gas replacing operation may be preferably continued until the moisture disappears while an amount of moisture contained in the exhausted gas is monitored by employing the dew-point instrument 32 which is installed in the exhausting pipe located at the down stream of the port 26. A time duration required for executing this baking process operation is approximately 12 hours. It should be noted that the temperature of the baking process operation by the replacement gas is not limited to 60° C.

Since the replacement gas heated-at the high temperature may have a capability of releasing the out gas from the inner walls of the housing 16 and the partial reflection films of the etalon, as compared with that of the replacement gas at the normal temperature. Therefore, the baking effect can be achieved within short time in the case where the baking process operation is carried out at a higher temperature than 60° C. However, when nitrogen gas at an extremely high temperature, for example, higher than or equal to 200° C. is filled into the housing 16, a contact portion (normally, optical contact portion) between the spacer 3 and the optical substrate 2 in the etalon is destroyed or the adhesive agent constituting the adhesive agent layer 4 is solved. Then, the quality or characteristic of the etalon itself is changed or the O-ring for maintaining the airtight characteristic is thermally changed to deteriorate the sealing performance. As a consequence, it is important to execute the baking process operation at such a temperature that no adverse influence is given to these items. Conversely, in the case where dry nitrogen gas heated at a normal temperature or a low temperature is used, the higher baking effect may be achieved by increasing the baking time. In either case, partial pressure of moisture in the housing can be lowered by using such a nitrogen gas whose moisture concentration is low.

Alternatively, by decreasing pressure in the housing to establish a condition approximated to a vacuum condition instead of baking the replacement gas at a higher temperature, the baking effect can be obtained. In this case, the out gas (containing moisture) becomes easily vaporized by increasing the temperature of the replacement gas.

In the case where the values are employed which are measured by employing both the temperature meter and the pressure meter installed in the housing, a refractive index of a gaseous body between the air gaps of the etalon may be correctly calculated. As a result, the wavelength can be detected with a small detection error.

Furthermore, the baking process operation may be preferably carried out with respect to the replacement gas in the above-mentioned manner after the housing 16 itself, and the etalon and other various components arranged in the housing 16 have been previously baked so as to previously remove moisture and so on absorbed by their wall planes. In this case, an amount of moisture and so on released from their wall planes can be decreased.

As the preceding baking method, for instance, while such components as the etalon whose characteristics are relatively sensibly damaged by heat are removed, the housing 16 is entirely entered into the thermostatic chamber 28 and heated for approximately two hours at 100° C. In this case, the following processes may be preferably carried out. That is, dry nitrogen gas heated at a higher temperature (for instance, 100° C.) may be injected into the housing 16 through the filling pipe to execute the preceding baking process. Alternatively, pressure inside the housing 16 may be reduced to establish a condition approximated to a vacuum condition.

Also, in order to reduce a total amount of released moisture and so on, after a plating process in which a fluorine process is added to a multi-layer nickel plating process (namely, "clean S process" by SHOWA DENKO COMPANY) has been performed with respect to the internal portion of the housing and the components set in this housing, the above-explained preceding baking process and also the baking process of the replacement gas may be preferably carried out.

Next, a third embodiment of the present invention is explained.

Figure 6:
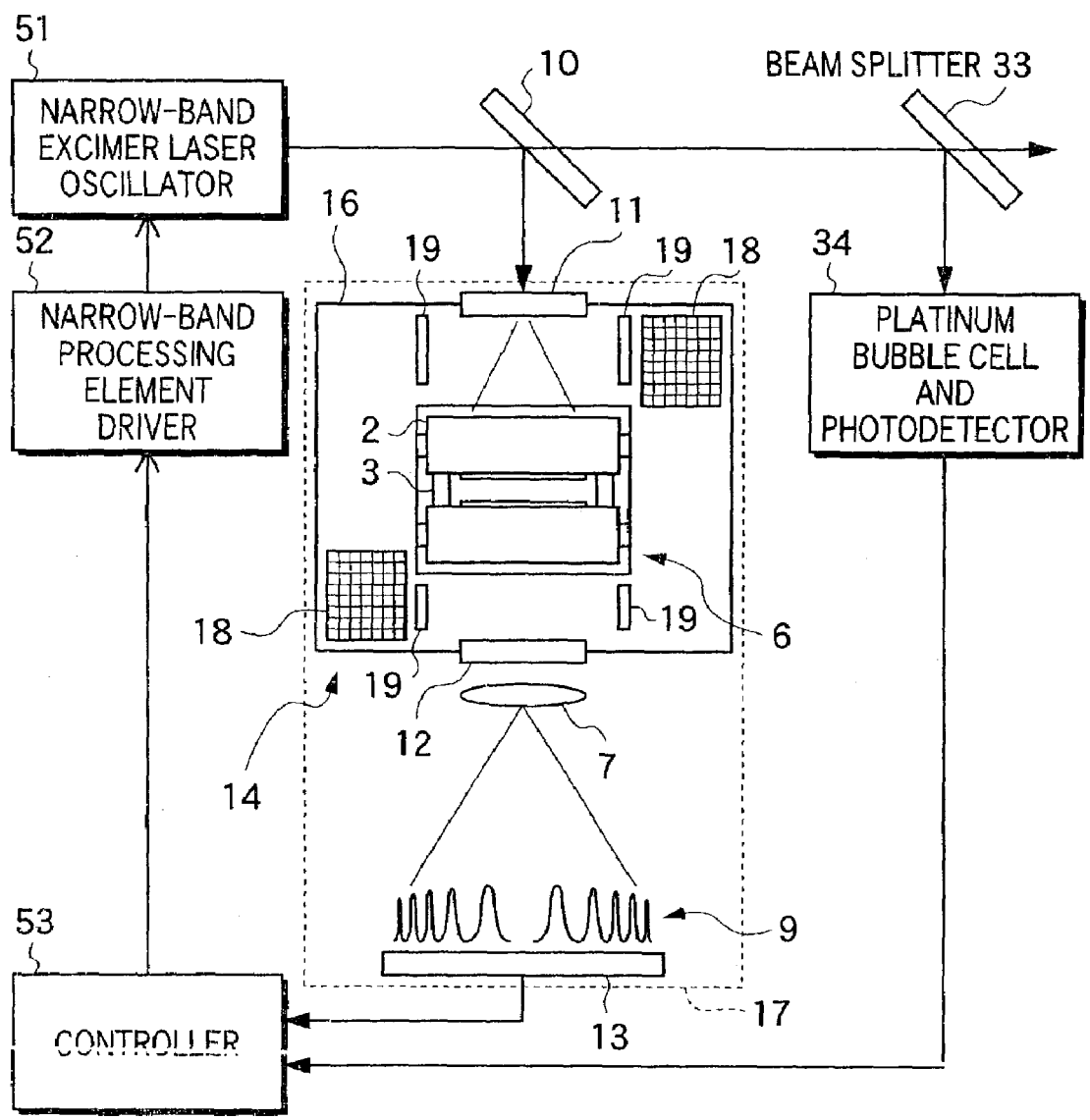
FIG. 6 is a diagram for showing an arrangement of a laser apparatus according to a third embodiment of the present invention.

FIG. 6 shows an arrangement of a laser apparatus according to the third embodiment of the present invention in the case of an ArF excimer laser. In this third embodiment, in addition to the arrangement of the first embodiment, both a platinum bubble cell and a photodetector 34 are furthermore provided for a calibration purpose. As to this platinum bubble cell, absorption lines are present in an oscillating wavelength range of the ArF excimer laser.

A laser beam generated from a narrow-band ArF excimer laser oscillator 51 is partially reflected by a beam splitter 10 to be projected to a wavelength detecting apparatus 17. The remaining laser beam is split by a beam splitter 33. Then, a portion of the split laser beam is reflected to enter into the platinum bubble cell 34.

A correction value is calculated based upon a fringe waveform 9 detected by a line sensor 13 of the wavelength detecting apparatus 17, and this correction value is transferred to a controller 53. The controller 53 executes a wavelength control operation via a narrow-band processing element driver 52 in order to shift a wavelength selected by a wavelength selection element arranged within a resonator of the ArF excimer laser. To calibrate the wavelength of the laser beam, the oscillating wavelength of the ArF excimer laser is swept by the controller 53, and then, an output signal of the photodetector 34 is monitored. In this case, a wavelength of an absorption line caused by platinum vapor generated from the platinum cell is utilized as a reference wavelength, and the wavelength detecting apparatus 17 is calibrated by employing the following calibration formula (2).

$$\lambda = \lambda_0 + Cd(r^2 - r_0^2) + N \cdot FSR \qquad (2)$$

In this formula (2), symbol "$\lambda$" represents a wavelength corresponding to the fringe radius "r"; symbol "$\lambda_0$" represents a wavelength corresponding to another fringe radius "$r_0$" and a wavelength of an absorption line caused by platinum vapor as a calibration reference; symbol "Cd" represents a constant depending upon optical design; symbol "FSR" represents a free spectrum range of the etalon; and symbol "N" represents an integer.

In this third embodiment, variation of the fringe angle "θ" in connection with the water absorption and desiccation in the partial reflection film of the etalon is small, and the stability of the wavelength measurement is secured. As a result, the calibration interval with the downtime can be largely extended. Furthermore, since the wavelength of the absorption line of the platinum vapor generated from the platinum bubble cell is used as the reference wavelength, the calibration with having less error can be carried out based upon the above-mentioned formula (2).

Next, a description will now be made of a fourth embodiment of the present invention.

Figure 7:
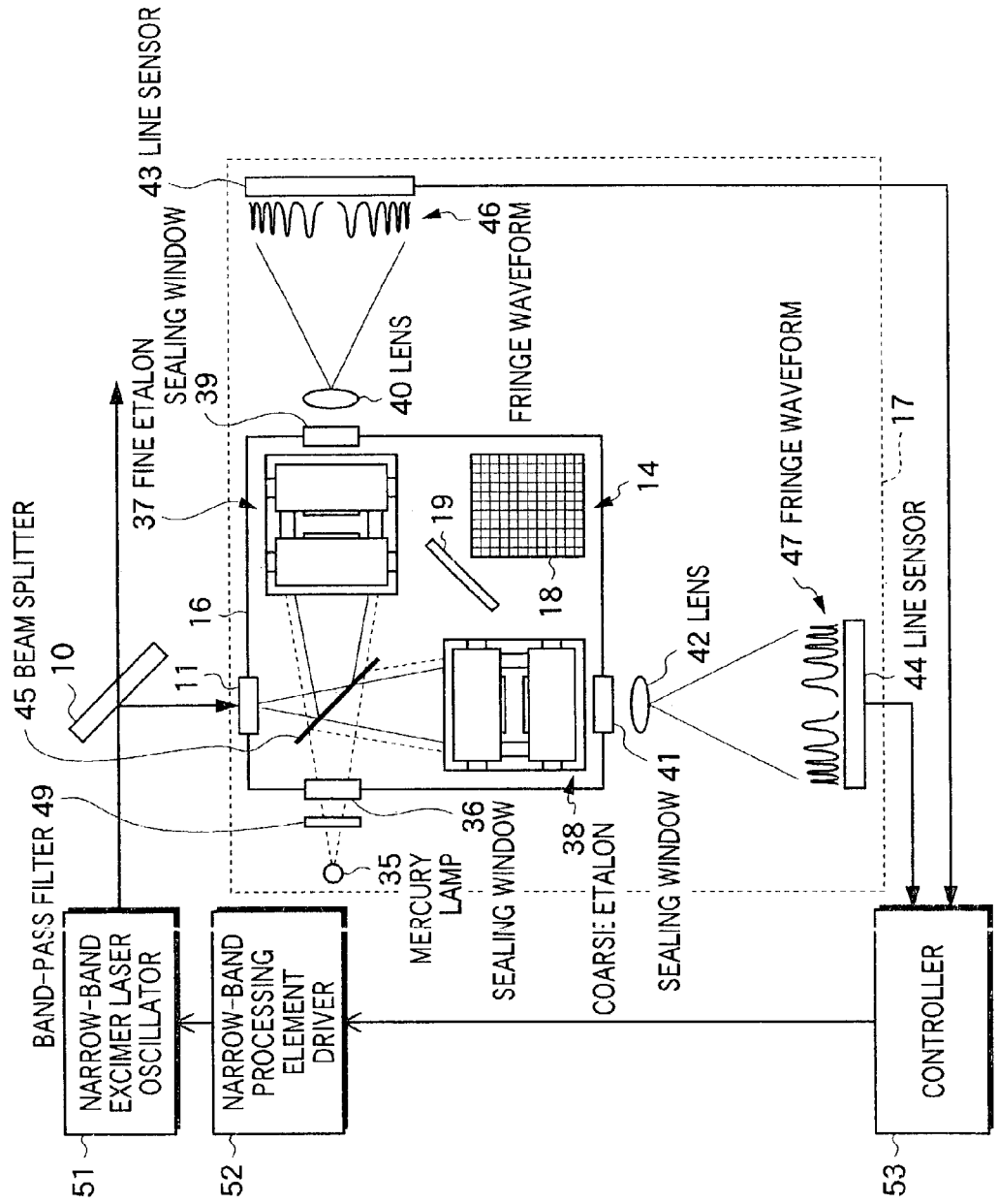
FIG. 7 is a diagram for showing an arrangement of a laser apparatus according to a fourth embodiment of the present invention.
Figure 8:
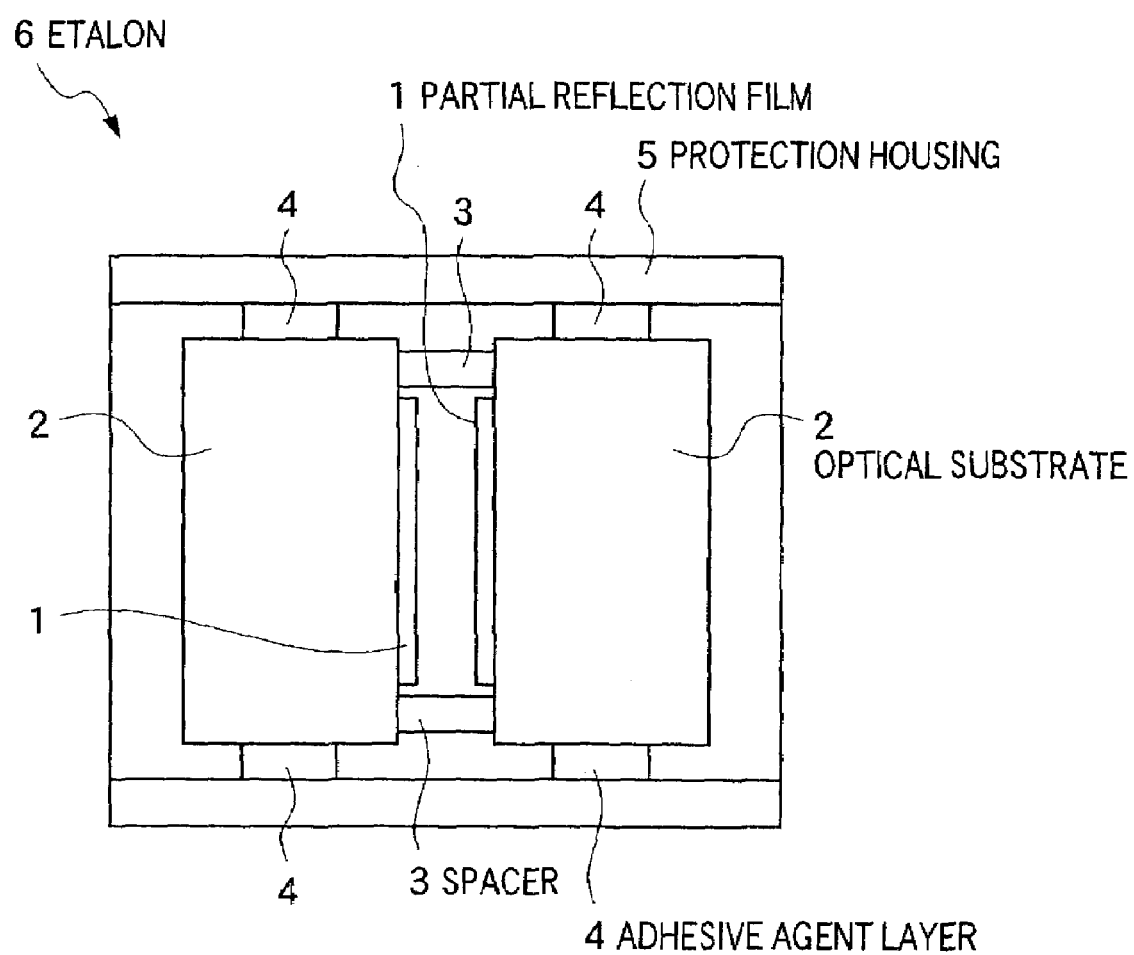
FIG. 8 is a diagram for showing a concrete example of a general-purpose etalon used in the wavelength detecting apparatus.
Figure 9A:
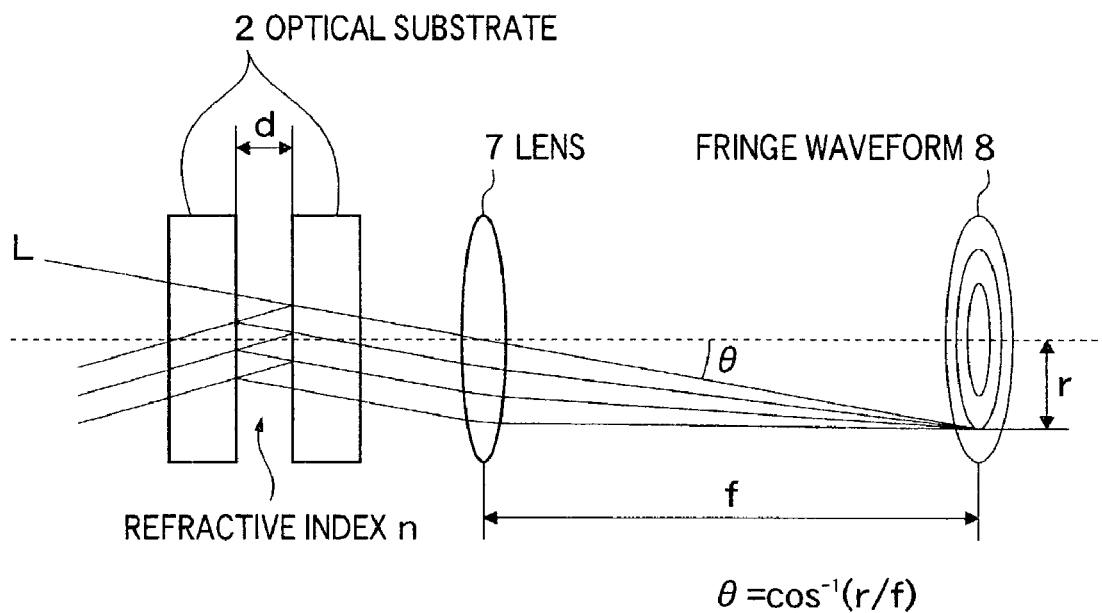
FIG. 9A is a diagram for showing construction for forming a fringe waveform by using the etalon.
Figure 9B:
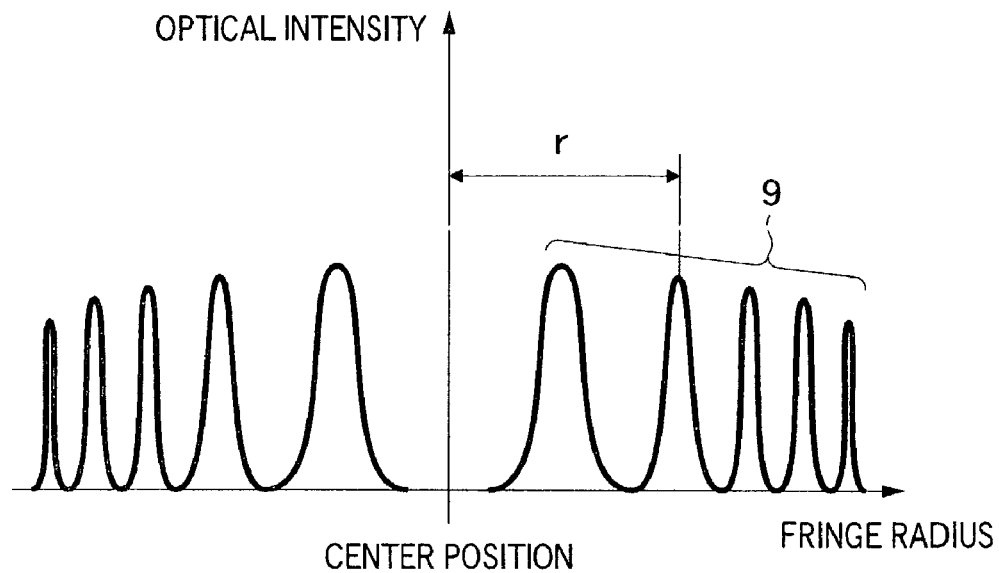
FIG. 9B is a diagram for showing optical intensity in relation to the fringe waveform.

FIG. 7 shows an arrangement of a laser apparatus according to the fourth embodiment in the case of an ArF excimer laser.

A mercury lamp 35 for a calibration purpose is arranged in a wavelength detecting apparatus 17 shown in FIG. 7. In an etalon type spectroscope 14, a coarse etalon 38 is arranged under the diffusing plate 11, which diffuses a portion of the laser beam reflected by the beam splitter 10, via a beam splitter 45. Both a band-pass filter 46 and a sealing window 36 are arranged in this order at a right hand of the mercury lamp 35. Further, a fine etalon 37 is arranged at the right hand via the beam splitter 45. A moisture-absorbing unit 18 is arranged at a corner portion sandwiched between the coarse etalon 38 and the fine etalon 37. A shielding wall 19 is provided between the moisture-absorbing unit 18 and the beam splitter 45. Also, both a lens 42 and a line sensor 44 are arranged in this order under the coarse etalon 38, and both a lens 40 and a line sensor 43 are arranged in this order at a right hand of the fine etalon 37. In this case, the laser apparatus system employing the ArF excimer laser and platinum vaporization is described, but the present invention is not limited thereto. Alternatively, the present invention may be realized by combining ultraviolet ray lasers such as a KrF excimer laser and a fluorine molecular laser with a cell into which gaseous bodies capable of absorbing light having a wavelength within their oscillating wavelength ranges is filled.

Light emitted from the mercury lamp 35 passes through the sealing window 36, and then, is distributed into the two coarse and fine etalons 38 and 37 by the beam splitter 45. Since a bandpass filter 49 capable of transmitting light having such a wavelength of, for example, 253.7 nm is provided, a fringe waveform having a better S/N ratio can be monitored.

The light which has passed through the respective etalons may project fringe waveforms 46 and 47 via the sealing windows 39 and 41 and the lenses 40 and 42 to the line sensors 43 and 44. In this fourth embodiment, the laser beam is not entered into the housing 16 by stopping the oscillating operation of the narrow-band excimer laser oscillator 51 or by closing a shutter (not shown) under control of the controller 53. On the other hand, the light emitted from the mercury lamp 35 is conducted to the housing 16 by turning on this mercury lamp 35 or by opening another shutter (not shown) under control of the controller 53. Then, while the wavelength of the light produced from the mercury lamp 35 is employed as the reference wavelength "$\lambda_e$", the wavelength calibration is carried out by using the following calibration formula (3).

$$\lambda = \lambda_e + FSR(r^2 - r_0^2)/C \quad (3)$$

In this formula (3), symbol "$\lambda$" represents a wavelength corresponding to the fringe radius "r"; "$\lambda_e$" represents a wavelength of light to be detected when a wavelength of light generated from the mercury lamp as a reference of calibration is made coincident with a fringe radius of the light to be detected; symbol "$r_0$" represents a fringe radius corresponding to a wavelength of an emission line of the mercury lamp as the reference of calibration; symbol "C" represents a constant depending upon the etalon; and symbol "FSR" represents a free spectrum range of the etalon. The wavelength calibration is performed by actually measuring the values of $r_0$ and C.

In this fourth embodiment, variation of the fringe angle "θ" in connection with the water absorption and desiccation in the partial reflection film of the etalon is small, and the stability of the wavelength measurement is secured. As a result, an interval of the calibration which calibration causes the downtime can be largely extended. Furthermore, since the wavelength of the light generated by the mercury lamp is used as the reference wavelength, the calibration can be carried out based upon the above-mentioned formula (3), in which the wavelength "$\lambda_e$" is made constant and the calibration error is reduced.

As previously explained, according to the present invention, the drifts of the characteristics in connection with the moisture absorption and desiccation of the partial reflection films of the etalon can be stabilized, and also, the adverse influence due to the out gas can be eliminated, so that the wavelength can be correctly measured. Also, the laser apparatus capable of controlling the wavelength of the laser beam based upon such a measurement can be provided. Furthermore, since the out gas can be absorbed by the moisture-absorbing agent, it is possible to avoid CVD (chemical vapor deposition) caused by irradiating the laser beam to the optical element such as the etalon, so that the lifetime of the optical element can be considerably extended.

The invention claimed is:

1. A wavelength detecting apparatus comprising:
    a housing to be sealed and equipped with a port for introducing replacement gas;
    an etalon set inside said housing;
    a moisture-absorbing unit for absorbing at least moisture released inside said housing; and
    a shielding wall for shielding light incident upon said moisture-absorbing unit and allowing a gaseous body to be reached to said moisture-absorbing unit.

2. A wavelength detecting apparatus according to claim 1, wherein:
    said housing is further equipped with an incident window for introducing the an ultraviolet laser beam;
    said etalon set has two optical substrates, on which partial reflection films are provided respectively, and a spacer arranged between said two optical substrates to maintain a predetermined gap between said partial reflection films, said etalon set selectively transmitting light from said incident window in accordance with a wavelength thereof; and
    said moisture-absorbing unit absorbs at least moisture released inside said housing so as to reduce absorption of the at least moisture into said partial reflection films.

3. A wavelength detecting apparatus comprising:
    a housing to be sealed and equipped with a port for introducing replacement gas;
    an etalon set inside said housing; and
    a moisture-absorbing unit for absorbing at least moisture released inside said housing, wherein:
    both a replacement gas-filling pipe equipped with a drying filter into which desiccating agent is filled and a replacement gas exhausting pipe equipped with a dew-point instrument are connected to said housing.

4. A wavelength detecting apparatus according to claim 3, wherein:
    said housing is further equipped with an incident window for introducing the an ultraviolet laser beam;
    said etalon set has two optical substrates, on which partial reflection films are provided respectively, and a spacer arranged between said two optical substrates to maintain a predetermined gap between said partial reflection films, said etalon set selectively transmitting light from said incident window in accordance with a wavelength thereof; and
    said moisture-absorbing unit absorbs at least moisture released inside said housing so as to reduce absorption of the at least moisture into said partial reflection films.

* * * * *

UNITED STATES PATENT AND TRADEMARK OFFICE
CERTIFICATE OF CORRECTION

PATENT NO. : 7,196,796 B2
APPLICATION NO. : 10/341364
DATED : March 27, 2007
INVENTOR(S) : Moriya et al.

It is certified that error appears in the above-identified patent and that said Letters Patent is hereby corrected as shown below:

On the title page: item

(73) Assignee should be listed as --Gigaphoton Inc., Tokyo (JP)-- not "Gigaphoto [,] Inc., Tokyo (JP)."

Column 16, Claim 2, line 14 should read as follows: --for introducing an ultraviolet laser beam-- not "for introducing [the] an ultraviolet laser beam;"

Column 16, Claim 4, line 38 should read as follows: --for introducing an ultraviolet laser beam-- not "for introducing [the] an ultraviolet laser beam;";

Signed and Sealed this

Seventeenth Day of July, 2007

JON W. DUDAS
*Director of the United States Patent and Trademark Office*